(12) United States Patent
Zhou

(10) Patent No.: US 10,043,429 B2
(45) Date of Patent: Aug. 7, 2018

(54) AMOLED PANEL TEST CIRCUIT

(71) Applicant: EverDisplay Optronics (Shanghai) Limited, Shanghai (CN)

(72) Inventor: Xingyu Zhou, Shanghai (CN)

(73) Assignee: EVERDISPLAY OPTRONICS (SHANGHAI) LIMITED, Shanghai (CN)

( * ) Notice: Subject to any disclaimer, the term of this patent is extended or adjusted under 35 U.S.C. 154(b) by 131 days.

(21) Appl. No.: 15/214,636

(22) Filed: Jul. 20, 2016

(65) Prior Publication Data
US 2017/0046992 A1    Feb. 16, 2017

(30) Foreign Application Priority Data
Jul. 24, 2015  (CN) .......................... 2015 1 0443539

(51) Int. Cl.
*G09G 3/00*    (2006.01)
*G01R 31/44*   (2006.01)
*G09G 3/3225*  (2016.01)

(52) U.S. Cl.
CPC ............ *G09G 3/006* (2013.01); *G01R 31/44* (2013.01); *G09G 3/3225* (2013.01); *G09G 2330/12* (2013.01)

(58) Field of Classification Search
CPC .. G09G 3/006; G09G 2330/12; G09G 3/3225; G01R 31/44
See application file for complete search history.

(56) References Cited

U.S. PATENT DOCUMENTS

| 2009/0225009 A1* | 9/2009 | Ka ........................ G09G 3/3233 345/76 |
| 2010/0073009 A1 | 3/2010 | Wang et al. |
| 2014/0354285 A1* | 12/2014 | Kim ..................... G09G 3/3233 324/414 |

FOREIGN PATENT DOCUMENTS

| CN | 202736443 U | 2/2013 |
| CN | 103345914 A | 10/2013 |

* cited by examiner

*Primary Examiner* — Patrick Assouad
*Assistant Examiner* — Haidong Zhang
(74) *Attorney, Agent, or Firm* — Andrew F. Young, Esq.; Lackenbach Siegel, LLP

(57) ABSTRACT

The invention relates to the field of electronic circuit design technology, more particularly, to an AMOLED panel test circuit, by integrating the second test unit, the first test unit and the data line output unit together, and respectively achieves the test of the first test unit and the second test unit of the panel through switching on and off the transistor, avoids the problem that one of the test circuit needs to pass around the end of the panel because the test circuit is not integrated in prior art, which causes big line impedance, and increases the detection rate, and saves the cost.

8 Claims, 2 Drawing Sheets

AMOLED PANEL TEST CIRCUIT

CROSS-REFERENCE TO RELATED APPLICATIONS

The present application claims priority to and the benefit of Chinese Patent Application No. CN 201510443539.9, filed on Jul. 24, 2015, the entire content of which is incorporated herein by reference.

BACKGROUND OF THE INVENTION

Field of the Invention

The invention relates to the field of electronic circuit design technology, more particularly, to an AMOLED panel test circuit.

Description of the Related Art

AMOLED (Active-matrix organic light emitting diode, AMOLED for short) is a currently widely used display light emitting device, with the development of the technology, AMOLED technology matures gradually, and derives a lot of different types, such as AMOLED, Super AMOLED, Super AMOLED Plus, and Super AMOLED Advanced etc.

With the maturity of AMOLED technology, the cost of AMOLED gradually decreases, high efficient test during the testing and productive process becomes particularly important, timely testing and timely solving not only improves the yield of the production, but also saves time and improves the efficiency.

In current AMOLED, panel display test circuit and array substrate test circuit are separated: the array substrate test circuit tests the performance of the substrate before plating OLED, while the panel display test circuit tests the performance of the sub display test circuits after cutting. The array substrate test circuit tests the condition of every data line, while the panel display test circuit tests the same signals (e.g., monochrome red or green), using the way of shorting bar. With the increasing of PPI (pixels per inch), and by the method of rendering, a data line has different colors (like red and green), then the signal of the data line is AC (alternating current) signal, the load of the panel display test circuit can't be too large, otherwise the panel display test circuit can't be driven, however currently, the panel display test circuit needs to pass around the end of the display panel, hence the line impedance is very large, and cause of that, testing AMOLED display panel efficiently and accurately becomes a big problem for those skilled in the art.

SUMMARY OF THE INVENTION

In view of the above-mentioned problem, the invention provides an AMOLED panel test circuit, to achieve the test of the data line test unit by connecting the control unit and the data line test unit, and achieve the test of the display panel test unit by connecting the data line test unit and the display panel test unit, the technical solution specifically is:

an AMOLED panel test circuit, comprising:
a data line output unit, comprising a plurality of data line output modules, each of the data line output modules comprising a plurality of groups of data line pairs, one end of each data line of each of the data line pairs being coupled to one end of each of the other data line of the data line pairs to form a joint, and the other uncoupled ends of each of the data lines of each of the data line pairs of the data line output modules being used to provide output data;

a first test unit, comprising a plurality of sub-control units, each of the sub-control units comprising a plurality of branches, each of the branches exclusively corresponding to one group of the data line pair of the data line output modules, the branch being connected to the joint of the data line pair corresponding to the branch;

a second test unit, comprising a plurality of input signal lines, each of the input signal lines exclusively corresponding to one group of the data line pair of the data line output modules, the input signal line being connected to the joint of the data line pair corresponding to the input signal line.

The above-mentioned AMOLED panel test circuit, wherein the ejoint of the adjacent two data line output modules of the data line output unit are connected through a transistor, and the transistor is in the second test unit.

The above-mentioned AMOLED panel test circuit, wherein during working stage that the first test unit tests the data line output unit, output from the input signal lines of the second test unit are invalid.

The above-mentioned AMOLED panel test circuit, wherein each of the data line output modules only switches one of the transistors on to make each of the data line output modules only provide output data provided by one data line pair.

The above-mentioned AMOLED panel test circuit, wherein the transistors of each data line output module connecting to the data lines are all switched on, to make all the data lines of each of the data line output modules output data.

The above-mentioned AMOLED panel test circuit, wherein the sub-control units are switched off, to make the second test unit test the data line output unit.

The above-mentioned AMOLED panel test circuit, wherein the sub-control units are switched off, and the transistors are switched on to make the second test unit test the data line output unit.

The above-mentioned AMOLED panel test circuit, wherein the transistor, connecting to one of the data line pairs, of the data line output modules, to make only one of the data line pairs of each of the data line output modules provide output data.

The above-mentioned AMOLED panel test circuit, wherein the transistors of the second test unit are all switched on, to make the data lines of the data line output modules all provide output data.

An AMOLED panel test circuit, comprising:
a data line output unit, comprising a plurality of data line output modules, each of the data line output modules comprising a plurality of groups of data line pairs, one end of each data line of each of the data line pairs being coupled to one end of each of the other data line of the data line pairs to form a joint, the other ends not coupled with other data lines being used to provide output data;

a first test unit, comprising a plurality of sub-control units, each of the sub-control units comprising a plurality of branches, each of the branches exclusively corresponding to one data line pair of the data line output modules, each of the branches connecting to the joint of the data line pair corresponding to the branch; and a second test unit, comprising a plurality of input signal lines, each of the input signal lines exclusively corresponding to a data line pair of the data line output modules, each of the input signal lines being connected to the joint of the data line pair corresponding to it through a transistor.

The above-mentioned AMOLED panel test circuit, wherein the joint of a data line pair of a data line output module of the data line output unit and the joint of a data line pair of the data line output module adjacent to said data line output module are connected to a level line through a transistor, wherein the level line controls on and off state of the transistor.

The above-mentioned AMOLED panel test circuit, wherein output from the second test unit are invalid, to make the first test unit test the data line output unit.

The above-mentioned AMOLED panel test circuit, wherein the data line output module switches one of the transistors on, to make each of the data line output modules provide output data provided by one data line pair.

The above-mentioned AMOLED panel test circuit, wherein the transistors of the data line output modules connecting to the data lines are all switched on, to make data lines of the data line output modules all output data.

The above-mentioned AMOLED panel test circuit, wherein the sub-control units are switched off, to make the second test unit test the data line output unit.

The above-mentioned AMOLED panel test circuit, wherein the sub-control units are switched off, the input signal lines are all used to input signal, to make the second test unit test working stage of the data line output unit.

The above-mentioned AMOLED panel test circuit, wherein by controlling the level line connecting to the data line pair, the transistor connecting to the level line are switched on, to make only one data line pair of each of the data line output modules provide output data.

The above-mentioned AMOLED panel test circuit, wherein by controlling the level lines of the second test unit, all the transistors are switched on, to make the data lines of each of the data line output module of the data line output unit all provide output data.

The advantages and beneficial effects of the invention:

The invention integrates the second test unit, the first test unit and the data line output unit together, and respectively completes the test of the first test unit and the second test unit of the panel through switching on and off of the transistor, so as to avoid the problem that one of the test circuit needs to pass around the end of the panel because the test circuit is not integrated in prior art, which causes big line impedance, and increasing the detection rate, and save the cost.

BRIEF DESCRIPTIONS OF THE DRAWINGS

The accompanying drawings, together with the specification, illustrate exemplary embodiments of the present disclosure, and, together with the description, serve to explain the principles of the present invention.

DETAILED DESCRIPTION

Figure 1:
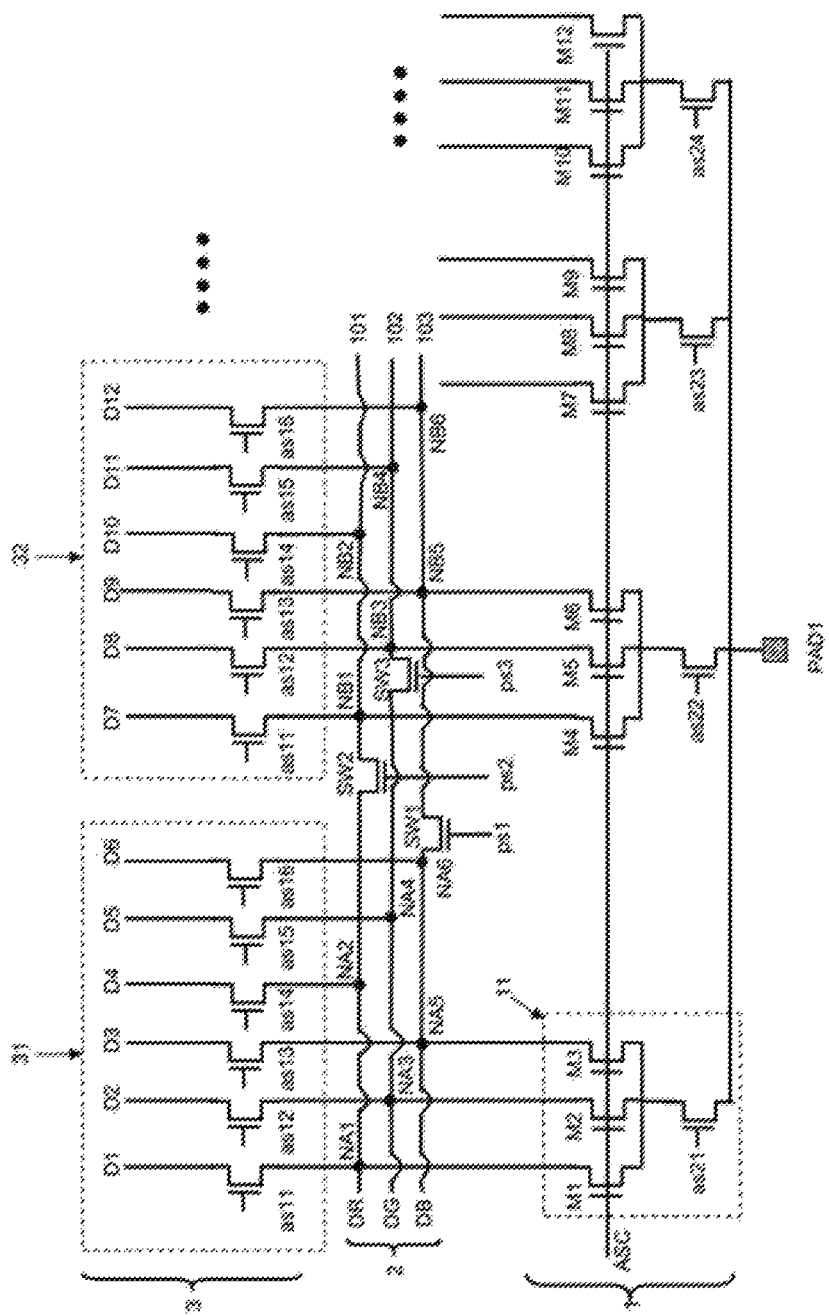
FIG. 1 is a structure diagram of AMOLED panel test circuit of the invention.

The present invention will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the term "plurality" means a number greater than one.

Hereinafter, certain exemplary embodiments according to the present disclosure will be described with reference to the accompanying drawings.

Referring to the structure shown in FIG. 1, the invention discloses an AMOLED panel test circuit, wherein the AMOLED panel test circuit comprises a first test unit 1, a data line output unit 3 and a second test unit 2, wherein:

The data line output unit 3 has one or more data line output modules (such as but not limited to, the data line output module 31 and the data line output module 32 listed in FIG. 1), each data line output module comprises one or more groups of data line pairs, one end of each data line of the data line pairs is coupled to one end of each of the other data line of the data line pairs to form a joint, and the other end, not coupled with other data lines, of each pair of the data lines of the data line output modules is used to provide output data.

The first test unit 1 comprises one or more sub-control units; each sub-control unit comprises one or more branches; each branch corresponds to a data line pair; the branch is connected to the joint of the data line pair corresponding to the branch. The second test unit 2 comprises one or more input signal lines, the input signal lines correspond to the data line pairs of the data line output modules, the input signal line connects to the joint of the data line pair corresponding to the input signal line.

As a preferred embodiment of the invention, the first test unit 1 of the AMOLED panel test circuit comprises four sub-control units; each sub-control unit comprises a transistor to control the switching-on or switching-off of the sub-control unit, each sub-control unit comprises a plurality of branches, each branch comprises a transistor; through the control of the sub-control units, all the data lines of the data line output unit are enabled to output data, or one or some of the data lines of the data line output unit are enabled to output data, and during the control process, the transistors of the second test unit are all switched off; when testing the second test unit, the transistors of the sub-control units of the first test unit and transistors of the branches are all switched off, through the control of transistors of the second test unit, the data lines of the data line output unit all or partly are enabled to output data.

The following lists specific embodiments for illustrating:

In a preferred embodiment of the invention, the input signal end PAD1 of the first test unit are connected to the transistors as21, as22, as23, as24 of the four sub-control units, and each transistor controls the data line output module exclusively corresponding to it by controlling the three transistors, namely the transistor as21 controls the data line output module 31 by controlling the transistor M1, the transistor M2, and the transistor M3; the transistor as22 controls the data line output module 32 by controlling the transistor M4, the transistor M5, and the transistor M6, and so on so forth; the invention elaborates the first data line output module 31 and the second data line output module 32, and principles of the subsequent multiple data line output modules are the same as the first data line output module 31 and the second data line output module 32, so not repeat here.

In a preferred embodiment of the invention, the data line output unit comprises four data line output modules, each data line output module comprises six data lines, namely three data line pairs; each data line pair is exclusively and correspondingly connected to a branch; for example the data line pair made up by the data line D1 and the data line D4 is exclusively and correspondingly connected to the branch which the transistor M1 is connected to, the branch, which the transistor M2 is connected to, is connected to the data line pair made up by the data line D2 and the data line D5; and so on so forth.

In a preferred embodiment of the invention, the input signal lines 101, 102 and 103 included in the display panel test unit are respectively input signals DR, DG and DB; a transistor SW2 is connected between the joint of first data line D1 and the forth data line D4 of the first data line output module 31 and the joint of the first data line D7 and the forth data line D10 of the second data line output module 32; and the first data line and the forth data line of the data line output module 31 and the data line output module 32, which are connected with each other, are connected to the input signal line 101, to input DR signal; likewise, a transistor SW3 is connected between the connecting data line D2 and the data line D5 and the connecting data line D8 and the data line D11 of the second data line output module, and the second data line and the fifth data line are connected to the input signal line 103, to input DG signal; a transistor SW1 is connected between the data line D3, the data line D6 and the data line D9, the data line D12, and the third data line and the sixth data line are connected to the input signal line 103, to input DB signal.

Firstly, input signals through the input signal end PAD1, switch off the transistor SW1 through ps1, switch off the transistor SW2 through ps2 and switch off the transistor SW3 through ps3, and each data line can receive signal from the input signal end PAD1 and output the signal.

Then control each data line to individually output signals received from the input signal end PAD1; here list several specific examples to elaborate:

Firstly, limit the data line D1 to individually output signal, since the test at this point is the test for the first test unit, so now continue to switch the transistor SW1 off, the transistor SW2 off and the transistor SW3 off, to switch the transistor as21 on, to switch the transistor as22 off, the transistor as23 off and the transistor as24 off, then the branch controlled by the transistor M4, the transistor M5 and the transistor M6, which is controlled by the transistor as22, is switched off, the branch controlled by the transistor M7, the transistor M8 and the transistor M9, which is controlled by the transistor as23, is switched off; the branch controlled by the transistor M10, the transistor M11 and the transistor M12, which is controlled by the transistor as24, is switched off, at this point only the data lines of the first data line output module output data, since the output signal from the first data line D1 is only needed, only the transistor as11 connecting to the first data line of the first data line output module is switched on, which is to make the first data line D1 individually output signals; similarly, if to make the data line D8 of the second data line output module individually output signal is needed, it only needs to switch the transistor as22 and the transistor as12 on, and switch the other transistors of the first test unit off, so as to achieve the limitation of making the second data line D8 of the second data line output module individually output signal.

By parity of reasoning, by achieving the individual outputting signal of each data line of the data line output module, the test for the first test unit is achieved.

To continue to test the second test unit, switch all transistors of the first test unit 3 on, and switch off the transistor as21 (or switch off the transistor M1, M2, and M3 controlled by the transistor as21), the transistor as22 (or switch off the transistor M4, M5 and M6 controlled by the transistor as22), the transistor as23 (or switch off the transistor M7, M8 and M9 controlled by the transistor as23), the transistor as24 (or switch off the transistor M10, M11 and M12 controlled by the transistor as24) of the first test unit, switch on the transistor SW1, the transistor SW2 and the transistor SW3 of the second test unit; at this point, the input signal line 101 is connected to the first data line and the fourth data line of each data line output module, as shown in figure, the input signal line 101 is connected with the first data line D1 of the first data line output module to the node NA1, and with the forth data line D4 of the first data line output module to the node NA2, and with the first data line D7 of the second data line output module to the node NB1, and with the forth data line D10 of the second data line output module to the node NB2; after inputting signal DR to the input signal line 101 of the second test unit, the first data line and the forth data line of each data line output module can output the input signal DR.

Similarly, the input signal line 102 connects with the second data line D1 of the first data line output module to the node NA3, and with the fifth data line D4 of the first data line output module to the node NA4, and with the second data line D7 of the second data line output module to the node NB3, and with the fifth data line D10 of the second data line output module to the node NB4; after inputting signal DG to the input signal line 102 of the second test unit, the second data line and the fifth data line of each data line output module can output the signal DG, which is input to the input signal line 102.

Similarly, the input signal line 103 connects with the third data line D1 of the first data line output module to the node NA5, and with the sixth data line D4 of the first data line output module to the node NA6, and with the third data line D7 of the second data line output module to the node NB5, and with the sixth data line D10 of the second data line output module to the node NB6; after inputting signal DB to the input signal line 103 of the second test unit, the third data line and the sixth data line of each data line output module can output the input signal DB.

Namely, after respectively inputting signals DR, DG and DB to the input signal lines 101, 102 and 103, then input signal lines having the same signal are connected together (such as D1, D4, D7, D10 . . . Are connected together; D2, D5, D8, D11 . . . are connected together; D3, D6, D9, D12 . . . are connected together); at this point, to display red, green and blue image is achieved, and the test for the display panel test unit is complete.

Figure 2:
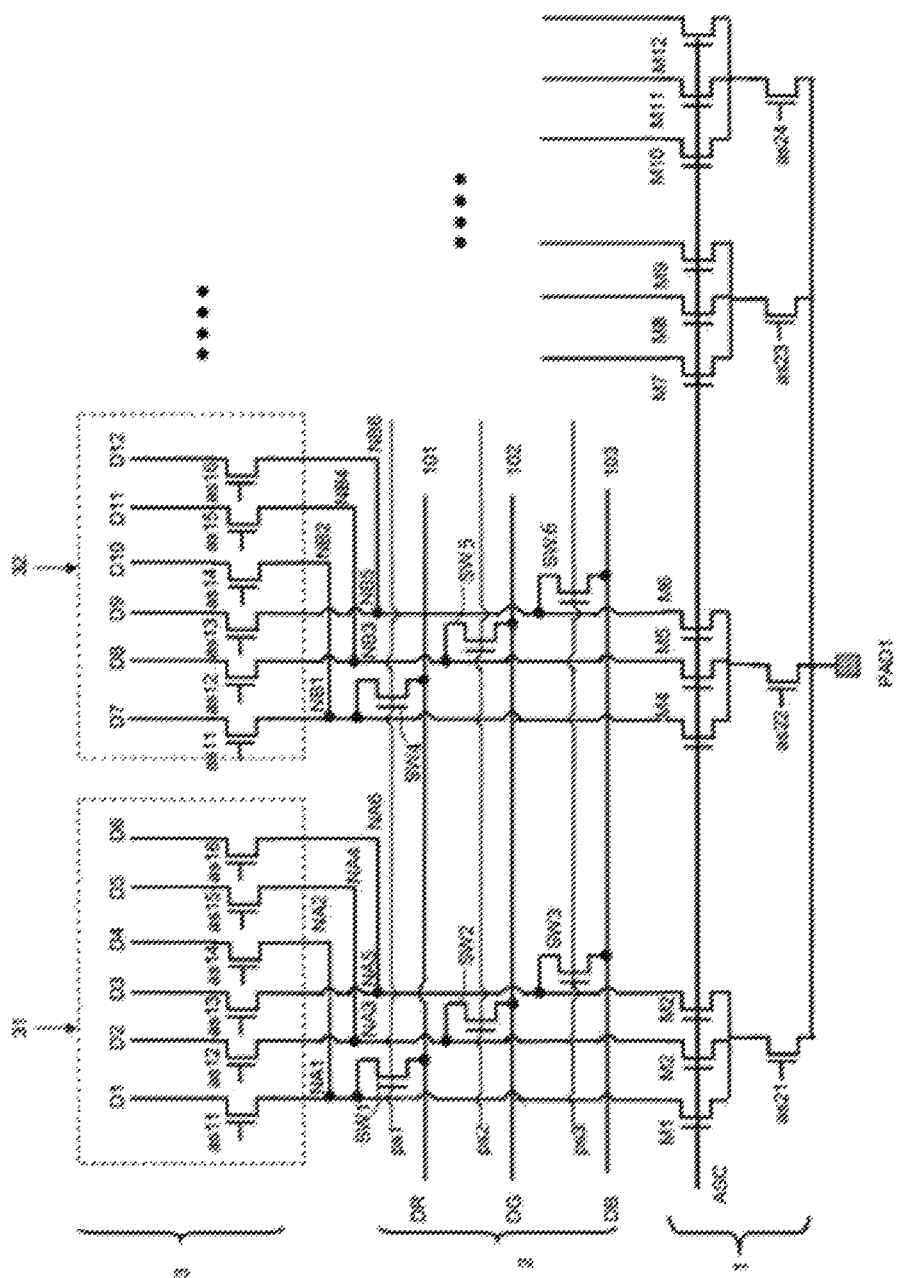
FIG. 2 is another structure diagram of AMOLED panel test circuit of the invention.

Referring to the structure shown in FIG. 2, the invention discloses another circuit structure which can achieve the same purpose of the above-mentioned embodiments, more specifically, the circuit structure comprises a first test unit 1, a data line output unit 3 and a second test unit 2, wherein:

the data line output unit 3 has one or more data line output modules, each data line output module comprises one or more groups of data line pairs, one end of each data line of each of the data line pairs is coupled to one end of each of the other data line of the data line pairs to form a joint, and the other uncoupled end of each pair of the data lines of the data line output modules is used to provide output data.

The first test unit 1 comprises one or more sub-control units, each sub-control unit comprises one or more branches, each branch corresponds to the data line pair of the data line output modules, each branch connects to the joint of the data line pair corresponding to the branch. The second test unit 2 comprises one or more input signal lines, each input signal line corresponds to a plurality of data line pairs of the data line output modules, the input signal line is connected to the joint of the data line pair corresponding to the input signal line.

Since the circuit structure is exactly the same as the connection of the first test unit and the data line output unit of the preferred embodiments of the above-mentioned circuit structure, and only the second test unit is slightly changed, and the connecting way of the first test unit and the data line output unit which is the same as the above mentioned circuit structure, which is not repeated here.

The following lists specific embodiments for elaborating:

As shown in FIG. 2, the first data line D1 and the fourth data line D4 of the first data line output module 31 are connected to the input signal line 101 through the transistor SW1, the second data line D2 and the fifth data line D5 of the first data line output module are connected to the input signal line 102 through the transistor SW2, the third data line D3 and the sixth data line D6 of the first data line output module are connected to the input signal line 103 through the transistor SW3; similarly, the first data line D7 and the fourth data line D10 of the second data line output module are connected to the input signal line 101 through the transistor SW4, the second data line D8 and the fifth data line D11 of the second data line output module are connected to the input signal line 102 through the transistor SW5, the third data line D9 and the sixth data line D12 of the second data line output module are connected to the input signal line 103 through the transistor SW6, wherein the input signal lines 101, 102 and 103 respectively input the signals DR, DG and DB.

Firstly, the input signal end PAD1 inputs signals to the 24 data lines of the data line output unit, then switch on the transistor as21, the transistor as22, the transistor as23 and the transistor as24 of the first test unit, so the transistors of the branches controlled by each transistor of the 4 transistors are switched on, namely the transistors M1, M2, . . . M11, M12 are all switched on; and switch off the transistors SW1, SW2, . . . SW4, SW5 . . . of the second test unit by the level lines ps1, ps2 and ps3, so all transistors as11, as12 . . . of the data line output unit connecting to data lines are switched on, then the input signal end PAD1 inputs signals to each data line, and each data line of the data line output unit outputs signals.

Here the input signal end PAD1 inputs signals to each data line will be listed as a few examples to illustrate.

Firstly, the input signal end PAD1 individually inputs signals to the second data line D2 of the first data line output module; then continue to switch off the transistors SW1, SW2, . . . SW4, SW5 . . . of the second test unit, switch on the transistor as21, and switch off the transistor as22, the transistor as23 and the transistor as24, so the transistors M1, M2 and M3 are all switched on, and the branches controlled by the transistors M4, M5, . . . M11, M12 are all switched off; at this point, only the data lines of the first data line output module have input signal; when the transistors as 11, the transistor as13, the transistor as14, the transistor as15 and the transistor as16 of the first data line output module are switched off, only the second data line D2 of the first data line output module has input signals; similarly, if we just need to input signals to the third data line D9 of the second data line output module, switch on the transistor as22, and switch off the transistor as21, the transistor as23 and the transistor as24, so the transistors M4, M5 and M6 are all switched on, and the branches controlled by the transistors M1, M2, M3, M6, M7, . . . M11, M12 are all switched off, at this point, only data lines of the second data line output module have input signals, when switch off the transistors as11, the transistor as12, the transistor as14, the transistor as15 and the transistor as16 of the second data line output module, only the third data line D9 of the second data line output module has input signal.

Continue to test the second test unit; input the signal DR to the input signal line 101, input the signal DG to the input signal line 102, and input the signal DB to the input signal line 103; if we just need to output display signal to the first data line and the fourth data line of each data line output module, we just need to switch on the transistors like the transistor SW1 and SW4 connecting to the first data line and the fourth data line by the control of the level line ps1, and switch off transistors like the transistor SW2, SW3, SW5 and SW6 connecting to the second data line and the fifth data line by the control of the level lines ps2 and ps3, then only the first data line and the fourth data line output signal.

Similarly, if we just need to output display signals to the second data line and the fifth data line of each data line output module, we just need to switch on transistors like the transistor SW2 and SW5 connecting to the second data line and the fifth data line by the control of the level line ps2, and switch off transistors like the transistor SW1 and SW4 connecting to the first data line and the fourth data line by the control of the level line ps1, and switch off transistors like the transistor SW3 and SW6 connecting to the third data line and the sixth data line by the control of the level line ps3; if we just need to output display signals to the third data line and the sixth data line of each data line output module, we just need to switch on transistors like the transistor SW3 and SW6 connecting to the third data line and the sixth data line by the control of the level line ps3, and switch off other transistors of the second test unit by the control of level lines; and if we need to output display signals to all data lines of the data line output unit to let them output signals, we just need to input the signal DR to the input signal line 101, input the signal DG to the input signal line 102, and input the signal DB to the input signal line 103, and meanwhile switch on transistors like the transistor SW1 and SW4 connecting to the first data line and the fourth data line by the control of the level line ps1, and switch on transistors like the transistor SW2 and SW5 connecting to the second data line and the fifth data line by the control of the level line ps2, and switch on transistors like the transistor SW3 and SW6 connecting to the third data line and the sixth data line by the control of the level line ps3, then we can achieve displaying red, green and blue image.

In conclusion, the invention integrates the second test unit, the first test unit and the data line output unit together, and respectively achieves the test of the first test unit and the second test unit of the panel through switching on and off of the transistor, so as to avoid the problem that one of the test circuit needs to pass around the end of the panel because the test circuit is not integrated in prior art, which causes big line impedance, and to increase the detection rate, and save the cost.

The foregoing is only the preferred embodiments of the invention, not thus limiting embodiments and scope of the invention, those skilled in the art should be able to realize that the schemes obtained from the content of specification and figures of the invention are within the scope of the invention.

What is claimed is:

1. An AMOLED panel test circuit, comprising:
   a data line output unit, comprising a plurality of data line output modules, each of the data line output modules comprising a plurality of groups of data line pairs, one end of each data line of each of the data line pairs being coupled to one end of each of the other data line of the data line pairs to form a joint, the other uncoupled ends of each of the data lines of each of the data line pairs being used to provide output data;
   a first test unit, comprising a plurality of sub-control units, each of the sub-control units comprising a plurality of branches, each of the branches exclusively corresponding to one pair of the data lines of the data line output modules, the branch being connected to the joint of the data line pair corresponding to the branch; and
   a second test unit, comprising a plurality of input signal lines, each of the input signal lines exclusively corresponding to one pair of the data lines of the data line output modules, the input signal line being connected to the joint of the data line pair corresponding to the input signal line;
   wherein the joint of the adjacent two data line output modules of the data line output unit are connected through a transistor configured in the second test unit;
   wherein the sub-control units are switched off, to make the second test unit test the data line output unit;
   wherein the sub-control units are switched off, and the transistors are switched on to make the second test unit test the data line output unit; and
   wherein the transistor, connecting to one of the data line pairs, of the data line output modules is switched on, to make only one of the data line pairs of each of the data line output modules provide output data.

2. The AMOLED panel test circuit according to claim 1, wherein during a working stage that the first test unit tests the data line output unit, output from the input signal lines of the second test unit are invalid.

3. The AMOLED panel test circuit according to claim 2, wherein the transistors of each of the data line output modules connecting to the data lines are all switched on, to make all the data lines of each of the data line output modules output data.

4. The AMOLED panel test circuit according to claim 1, wherein the transistors of the second test unit are all switched on, to make the data lines of the data line output modules all provide output data.

5. An AMOLED panel test circuit, comprising:
   a data line output unit, comprising a plurality of data line output modules, each of the data line output modules comprising a plurality of groups of data line pairs, one end of each data line of each of the data line pairs being coupled to one end of each of the other data line of the data line pairs to form a joint, the other ends not coupled with other data lines being used to provide output data;
   a first test unit, comprising a plurality of sub-control units, each of the sub-control units comprising a plurality of branches, each of the branches exclusively corresponding to one pair of the data lines of the data line output modules, each of the branches connecting to the joint of the data line pair corresponding to the branch; and
   a second test unit, comprising a plurality of input signal lines, each of the input signal lines exclusively corresponding to a data line pair of the data line output modules, each of the input signal lines being connected to the joint of the data line pair corresponding to the input signal line through a transistor;
   wherein the joint of a data line pair of a data line output module of the data line output unit and the joint of a data line pair of the data line output module adjacent to said data line output module are connected to a level line through a transistor, wherein the level line controls on and off state of the transistor;
   wherein the sub-control units are switched off, to make the second test unit test the data line output unit;
   wherein the sub-control units are switched off, the input signal lines are all used to input signal, to make the second test unit test working stage of the data line output unit; and
   wherein by controlling the level line connecting to the data line pair, the transistor connecting to the level line is switched on, to make only one data line pair of each of the data line output modules provide output data.

6. The AMOLED panel test circuit according to claim 5, wherein output from the second test unit are invalid, to make the first test unit test the data line output unit.

7. The AMOLED panel test circuit according to claim 6, wherein the transistors of the data line output modules, connecting to the data lines are all switched on, to make data lines of the data line output modules all output data.

8. The AMOLED panel test circuit according to claim 5, wherein by controlling the level lines of the second test unit all the transistors are switched on, to make the data lines of each of the data line output modules of the data line output unit all provide output data.

* * * * *